(12) United States Patent (10) Patent No.: US 8,135,037 B2
Boecker et al. (45) Date of Patent: Mar. 13, 2012

(54) METHOD AND APPARATUS TO ENCODE AND SYNCHRONIZE A SERIAL INTERFACE

(75) Inventors: Charles Boecker, Ames, IA (US); Scott Irwin, Ames, IA (US); Matthew Shafer, Ankeny, IA (US); Eric Groen, Ankeny, IA (US); Aaron Hoelscher, Ankeny, IA (US); Andrew Jenkins, Nevada, IA (US); David Black, Story City, IA (US)

(73) Assignee: MoSys, Inc., Santa Clara, CA (US)

( * ) Notice: Subject to any disclaimer, the term of this patent is extended or adjusted under 35 U.S.C. 154(b) by 13 days.

(21) Appl. No.: 12/548,135

(22) Filed: Aug. 26, 2009

(65) Prior Publication Data

US 2009/0316728 A1 Dec. 24, 2009

Related U.S. Application Data

(62) Division of application No. 11/178,958, filed on Jul. 11, 2005, now Pat. No. 7,599,396.

(51) Int. Cl.
*H04J 3/06* (2006.01)
*H03M 13/03* (2006.01)

(52) U.S. Cl. ........................................ 370/474; 370/503

(58) Field of Classification Search ........................ None
See application file for complete search history.

(56) References Cited

U.S. PATENT DOCUMENTS

| | | | | |
|---|---|---|---|---|
| 4,599,723 A * | 7/1986 | Eck | ............................. | 375/368 |
| 5,410,536 A * | 4/1995 | Shah et al. | ................. | 370/216 |
| 6,012,096 A * | 1/2000 | Link et al. | ................... | 709/233 |
| 6,650,140 B2 | 11/2003 | Lee et al. | | |
| 6,693,985 B2 | 2/2004 | Li et al. | | |
| 6,731,683 B1 | 5/2004 | Fiedler et al. | | |
| 6,738,917 B2 | 5/2004 | Hummel et al. | | |
| 6,738,942 B1 | 5/2004 | Sridharan et al. | | |
| 6,750,675 B2 | 6/2004 | Venkata et al. | | |
| 6,754,238 B1 | 6/2004 | Lentine et al. | | |
| 6,757,327 B1 | 6/2004 | Fiedler | | |
| 6,777,979 B1 | 8/2004 | Zhu et al. | | |
| 6,804,805 B2 * | 10/2004 | Rub | ............................. | 714/752 |

(Continued)

OTHER PUBLICATIONS

Chiarulli et al. "Making Virtual Memory Real: Integrating an Optical Memory Into the Memory Hierarchy" http://ipdps.cc.gatech.edu/1997/wocs/chiarull.pdf.

*Primary Examiner* — John Pezzlo
*Assistant Examiner* — Matthew Campbell
(74) *Attorney, Agent, or Firm* — Toler Law Group

(57) ABSTRACT

The present disclosure is generally directed to a method and apparatus to communicate data between two or more semiconductor devices. In an embodiment, a method includes synchronizing a master device with a slave device, where the master device includes a semiconductor device. Synchronizing includes transmitting a first synchronization marker data pattern via a first serial interface from the master device at a first time, and receiving a second synchronization marker data pattern via a second serial interface at the master device at a second time in response to transmitting the first synchronization marker data pattern. Synchronizing also includes determining, based at least in part on the first time and the second time, a third time when a reply is to be received by the master device in response to a request transmitted from the master device to the slave device.

19 Claims, 5 Drawing Sheets

U.S. PATENT DOCUMENTS

| | | |
|---|---|---|
| 6,831,523 B1 | 12/2004 | Pastorello et al. |
| 6,987,424 B1 | 1/2006 | Hein |
| 2004/0076119 A1 | 4/2004 | Aronson et al. |
| 2005/0058290 A1* | 3/2005 | Kryzak et al. ............... 380/268 |
| 2005/0135470 A1 | 6/2005 | Momtaz |
| 2005/0179782 A1 | 8/2005 | Endo |
| 2005/0286507 A1 | 12/2005 | Österling et al. |
| 2006/0047899 A1 | 3/2006 | Ilda et al. |

* cited by examiner

METHOD AND APPARATUS TO ENCODE AND SYNCHRONIZE A SERIAL INTERFACE

CLAIM OF PRIORITY

This application is a divisional application of, and claims priority from, U.S. patent application Ser. No. 11/178,958, now U.S. Pat. No. 7,599,396, filed Jul. 11, 2005, the contents of which are hereby incorporated in their entirety.

FIELD OF THE DISCLOSURE

The disclosure is generally related to chip-to-chip serial interfaces between semiconductor devices

BACKGROUND

As semiconductor device speeds increase, there is a desire for the bandwidth of communication between semiconductor devices to increase. The available bandwidth is determined at least in part by the interface to the semiconductor devices. One type of common interface to a semiconductor device is a parallel interface. Parallel interfaces often experience transmission problems at higher frequencies.

There are several serial interfaces that offer higher bandwidth compared to parallel interfaces, but at the sacrifice of increased latency. Accordingly, there is a need for a serial interface that offers a higher bandwidth, but with little or no increase in latency compared to a parallel interface.

DETAILED DESCRIPTION OF THE DRAWINGS

The present disclosure is generally directed to a method and apparatus to communicate data between two or more semiconductor devices. Serial interfaces using the disclosed method have a reduction in latency compared to conventional serial interfaces due to use of a particular data encoding scheme. The method enables features needed for a serial interface, such as limited run lengths and recognizable data boundaries to establish alignment.

In a particular illustrative embodiment, a method includes synchronizing a master device with a slave device, where the master device includes a semiconductor device. Synchronizing includes transmitting a first synchronization marker data pattern via a first serial interface from the master device at a first time and receiving a second synchronization marker data pattern via a second serial interface at the master device at a second time in response to transmitting the first synchronization marker data pattern. Synchronizing also includes determining, based at least in part on the first time and the second time, a third time when a reply is to be received by the master device in response to a request transmitted from the master device to the slave device.

In another embodiment, an apparatus includes a master device that includes a semiconductor device. The master device includes an encoder to generate a first synchronization marker data pattern, a transmitting interface to transmit, via a first serial interface, the first synchronization marker data pattern at a first time, and a receiving interface to receive, via a second serial interface, a second synchronization marker data pattern at a second time from a slave device in response to the transmitted first synchronization marker data pattern. The master device is configured to synchronize with the slave device based at least in part on the first time and the second time.

In another embodiment, an apparatus includes a first slave device that includes a semiconductor device. The first slave device includes a receiving interface to receive, via a first serial interface, a first synchronization marker data pattern. The first slave device also includes an encoder to generate a second synchronization marker data pattern in response to receipt by the first slave device of the first synchronization marker data pattern. The first slave device also includes a transmitting interface to transmit, via a second serial interface, the second synchronization marker data pattern. The second synchronization marker data pattern includes a subset of a plurality of data segments including a first data segment. The first data segment includes a first encoded data element and a first frame header that includes a first header and a copy of the first header, or the first data segment includes the first encoded data element and a first transition header that includes the first header and an inverse of the first header.

Figure 1:
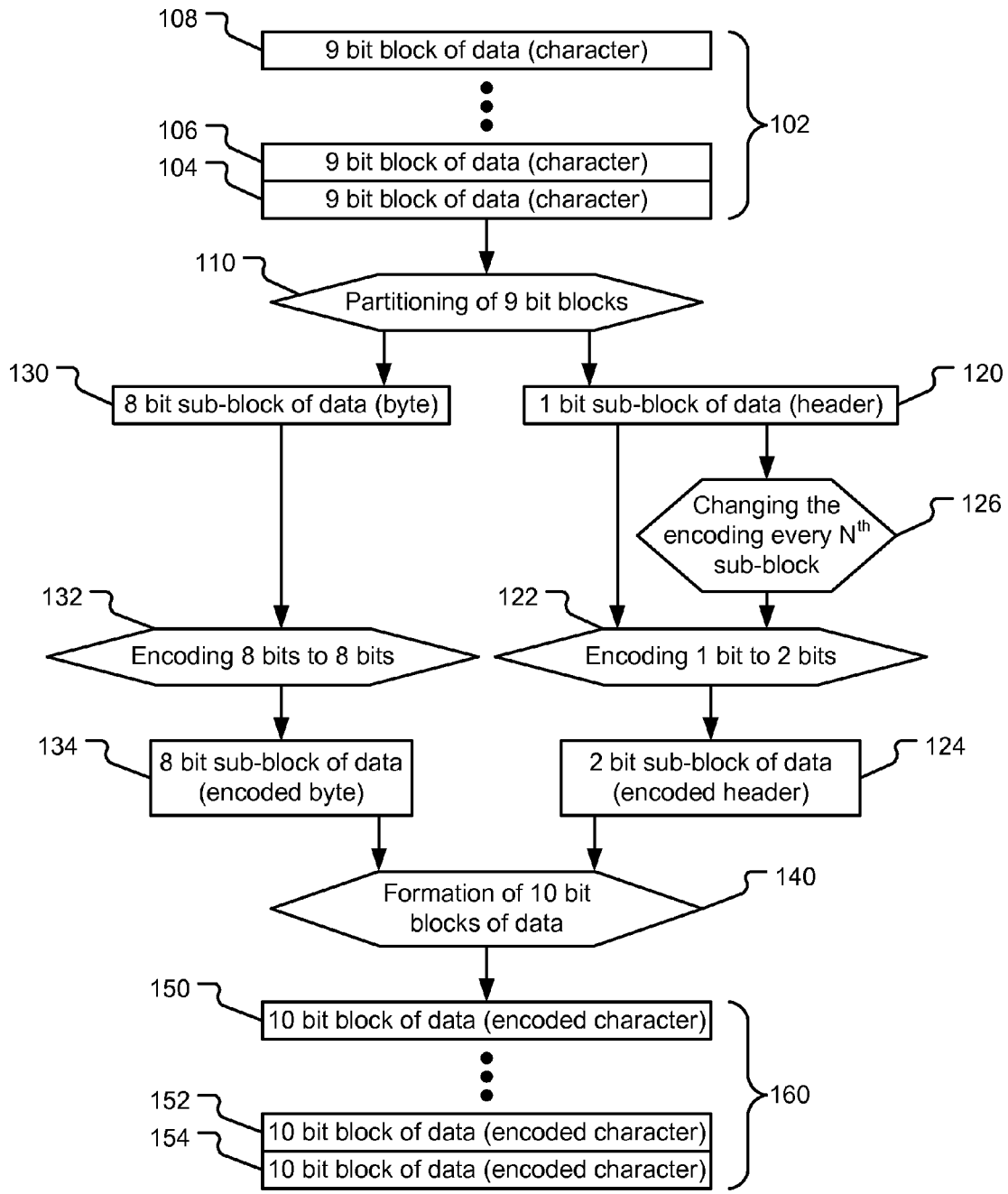
FIG. 1 is a flow diagram that illustrates an exemplary encoding process.

Referring to FIG. 1, a method of encoding data is shown that receives unconstrained data 102 as input and returns run length limited data 160 as an output. The unconstrained input data 102 includes nine bit blocks of data called characters 104, 106, and 108. The encoder processes these characters by partitioning, as shown at 110, the characters into eight bit sub-blocks called bytes 130 and one bit sub-blocks called headers 120. The bytes are encoded, at 132, into new eight bit sub-blocks called encoded bytes 134. The headers are encoded, at 122, into two bit sub-blocks called encoded headers 124. As shown at 126, the encoding of the headers changes periodically, such as every $N^{th}$ header that is encoded. In a particular embodiment, every $128^{th}$ header is encoded differently than the other headers. The encoded headers 124 and the encoded bytes 134 are grouped together, at 140, to form the run length limited data output 160 including a plurality of encoded characters, 150, 152, and 154. The encoded characters possess characteristics that make them suitable for transmission across a serial interface.

Figure 2:
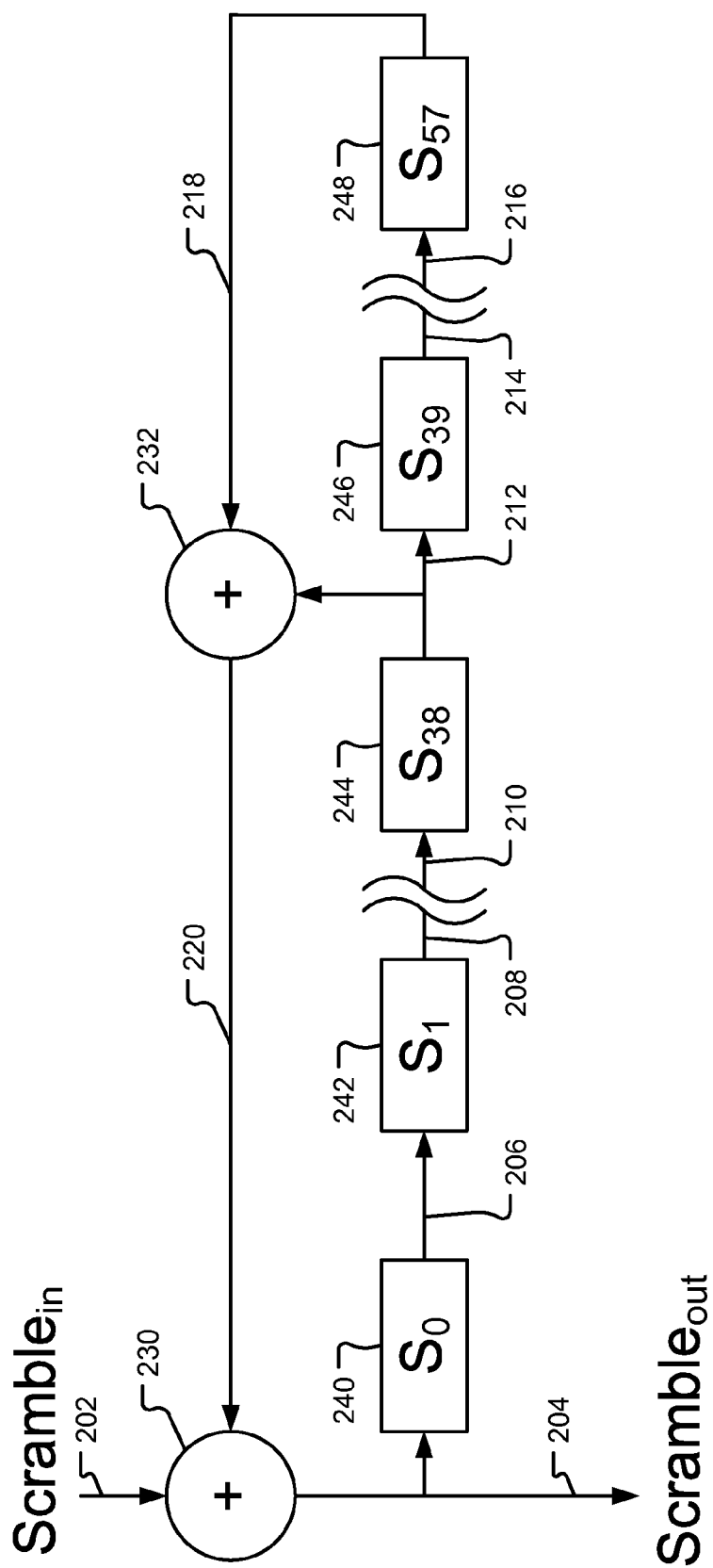
FIG. 2 is a functional diagram that illustrates a self-synchronizing scrambler implementing an exemplary polynomial.

FIG. 2 is a function block diagram that illustrates a particular implementation of a self synchronizing scrambler 200 using the polynomial $1+X^{39}+X^{58}$. This scrambler is one particular embodiment of a system to perform byte encoding 132 as shown with respect to FIG. 1. The scrambler 200 operates on one bit of data at a time. A scrambler input 202 is coupled to a two input XOR 230. The output of the XOR 230 is the scrambler output 204. The output of the scrambler 204 is also stored within the scrambler, through storage devices 240, 242, 244, 246, and 248 to scramble later received bits of data. It should be noted that many storage devices of the scrambler 200 are not specifically shown in FIG. 2. For example, storage registers between connections 208 and 210 and between connections 214 and 216 are not shown to simplify the figure. The updates of the storage registers are synchronized to the timing of the output data 204 of the scrambler. Connections between the registers 206, 208, 210, 212, 214, and 216 provide proper shifting of the data through the scrambler 200. Since the polynomial is $1+X^{39}+X^{58}$, the outputs of the $39^{th}$ register ($s_{38}$) 244 and the $58^{th}$ register ($S_{57}$) 248 are XORed together at XOR device 232. The output 220 of XOR device 232 is XORed with the input 202 in a feedback path, to produce a scrambled output with the desired polynomial.

Figure 3:
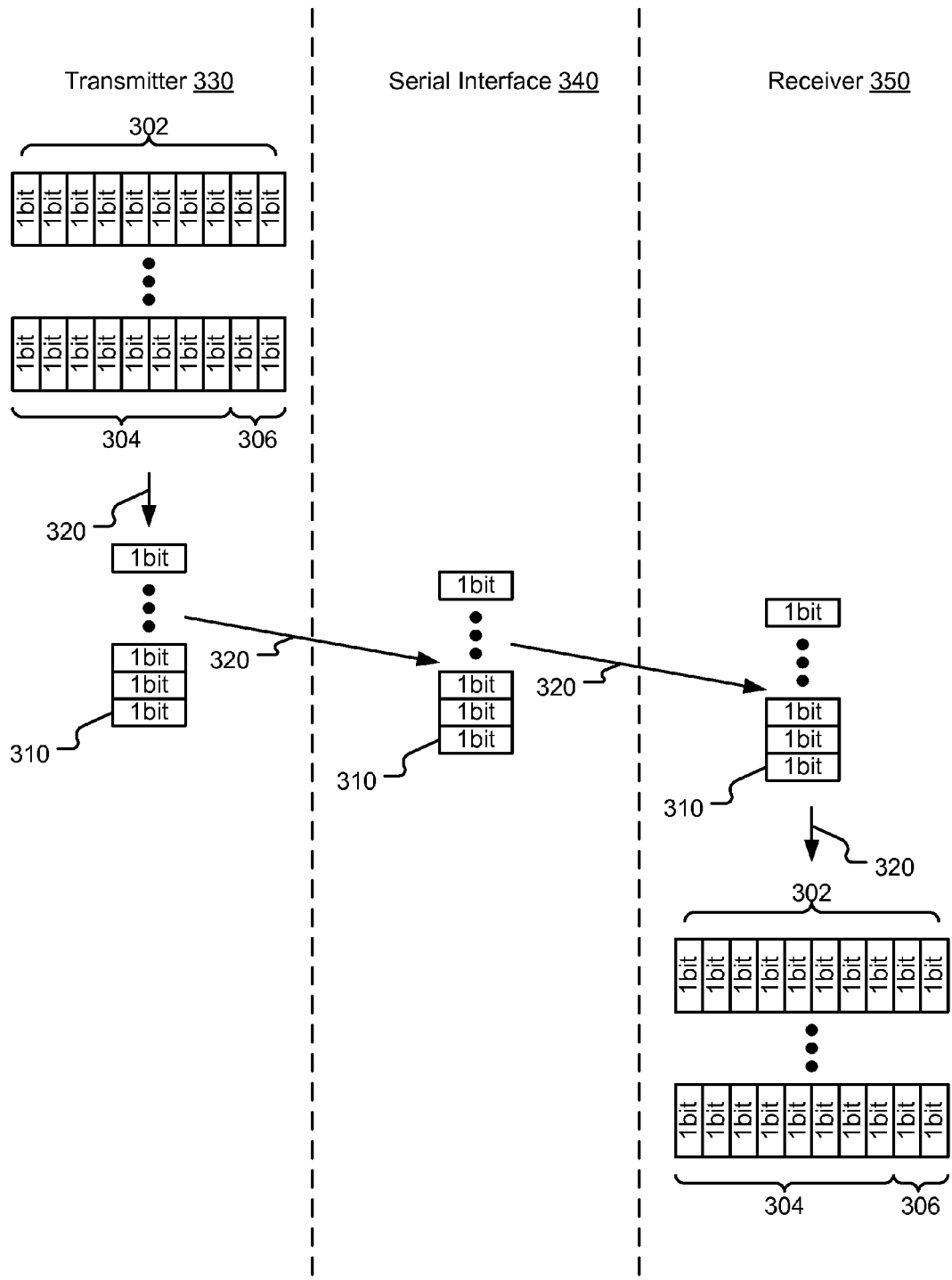
FIG. 3 is a general diagram that illustrates use by a single serial interface of the encoding process of FIG. 1 to transfer data between semiconductor devices.

FIG. 3 illustrates alignment to an encoded character (10 bit boundary) and a frame (N*10 bit boundary) using the encoding method described in FIG. 1. FIG. 3 is separated into three different sections. The transmitter section shows data events occurring in the sending device. Serial channel events are shown in the serial channel section. The events that occur in the receiving device are shown in the receiver section. Time progresses in the figure from top to bottom, so events that occur first are at the top. Events are separated by arrows 320. Encoded characters 302 are sent to the transmitter from a logic device. The encoded characters are made up of encoded bytes 304 and encoded headers 306. The encoded characters are transformed into a serial stream of bits 310. These bits are sent across the serial channel to the receiver. After the reception of the bits, an algorithm in the receiver searches for specific patterns within the serial stream of bits. These patterns define where encoded character and frame boundaries occur. Once these patterns are located, the serial interface is aligned accordingly. The same encoded characters 302 that were sent from the transmitter are formed at the receiver. The alignment described applies to a system with one or more transmitters and one or more receivers.

Figure 4:
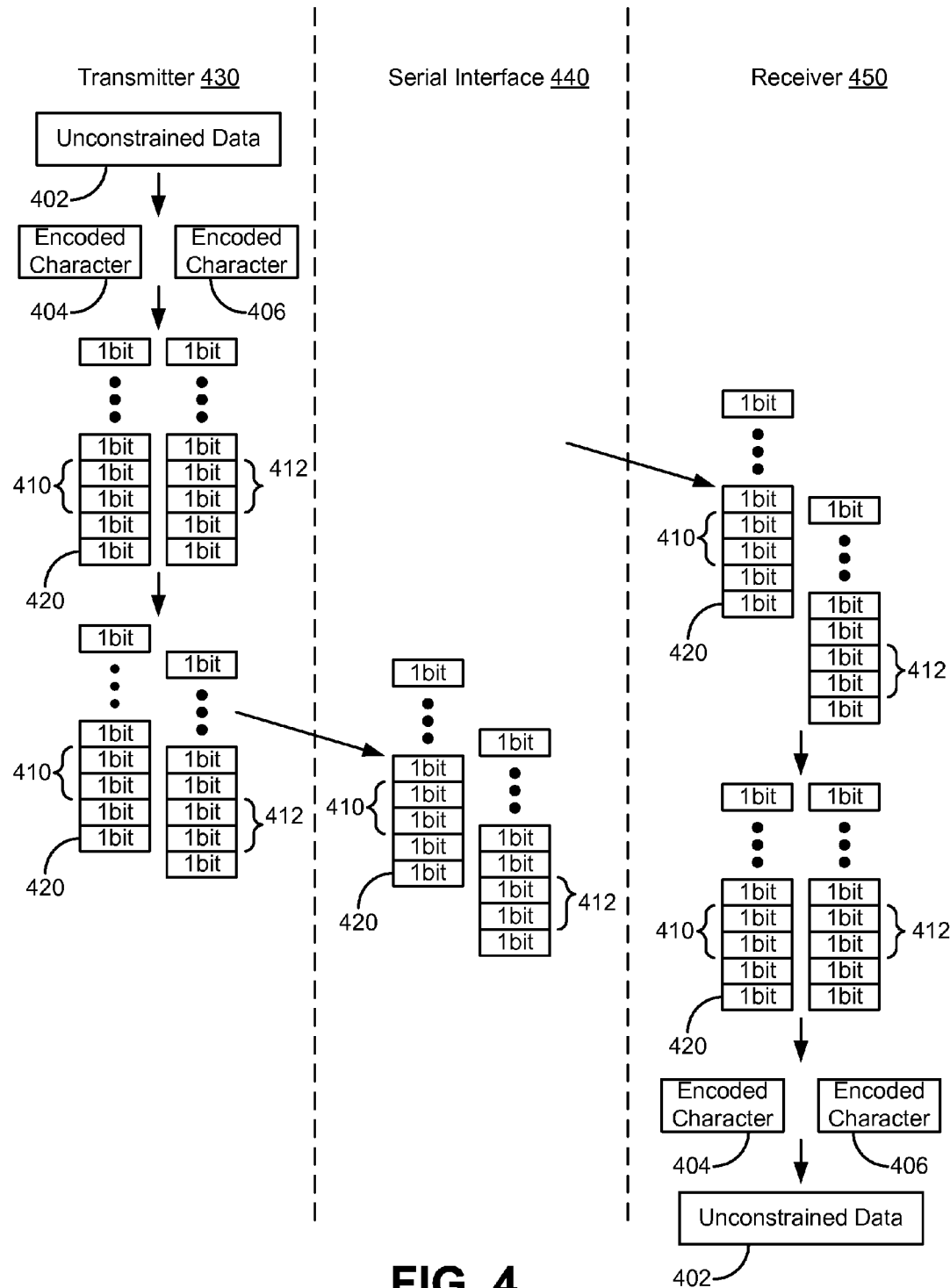
FIG. 4 is a diagram that illustrates use by multiple serial interfaces of the encoding process of FIG. 1 to transfer data.

FIG. 4 illustrates alignment in a system with a plurality of serial channels. The figure follows the same conventions described in FIG. 3 in terms of separation of the sections, separation of the events, and time progression. Unconstrained data 402 enters the transmitter section. This data is divided into separate paths and encoded into encoded characters 404 and 406. The number of paths that the unconstrained data 402 is divided into depends on the number of serial channels. In this case, there are two serial channels, so the data is divided into two separate paths. The encoded characters are converted into serial streams. The serial streams are made of bits 420. Markers 410 and 412 are used to provide proper alignment of the data at the receiver. As the data passes through the serial channels, the markers may become misaligned. Each receiver performs the alignment as described in FIG. 3 on its respective serial stream. In addition, the markers 410 and 412 embedded in the serial stream are aligned to each other. After this occurs, valid data can be reconstructed in the form of encoded characters 404 and 406 and, finally, into the original data sent 402.

Figure 5:
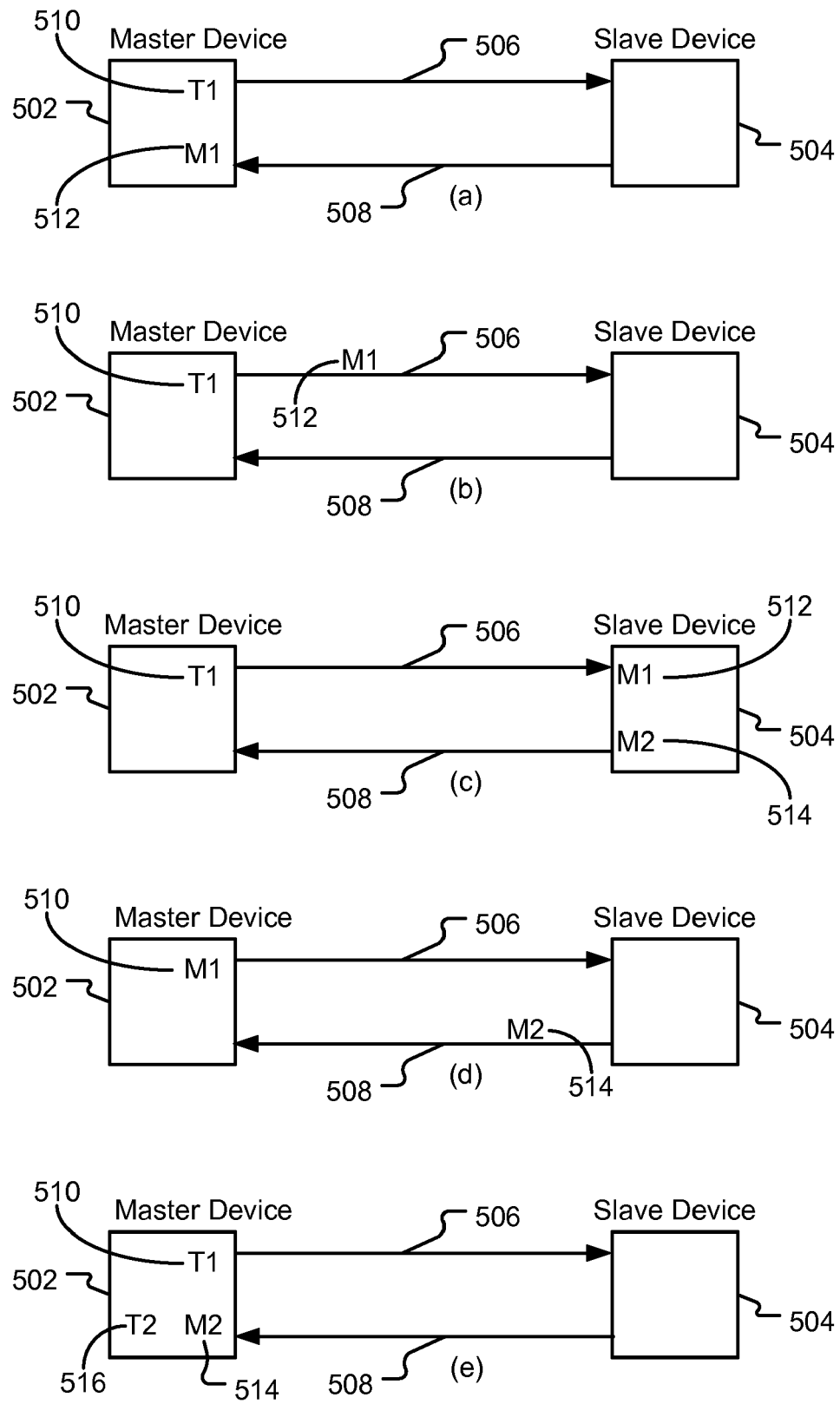
FIG. 5 illustrates synchronizing two semiconductor devices through their serial interfaces.

FIG. 5 describes a method for synchronizing two semiconductor devices using serial interfaces. The figure shows how synchronization of two semiconductor devices is achieved by looking at five different events. (FIG. 5a) At the beginning of a synchronization event 510, T1, a marker 512, M1, is generated by the master device 502. (FIG. 5b) Marker 512, M1, represents a specific data pattern that is sent out of the master device 502 on the downstream serial interface 506. (FIG. 5c) When the slave device 504 receives marker 512, M1, it then generates a second marker 514, M2. (FIG. 5d) The marker 514, M2, represents a specific data pattern that is sent out of the slave device 504 on the upstream serial interface 508. (FIG. 5e) Synchronization event 516, T2, occurs when the master device 502 receives marker 514, M2. T1, 510, represents the time the synchronization event started and T2, 516, represents the time the synchronization event finished. The difference between T1, 510, and T2, 516, is used to synchronize the two semiconductor devices. This method can be expanded to a system containing more than two semiconductor devices with any combination and configuration of slave and master devices. It should be noted that a single device can be both a slave and a master. The device can be a slave to a particular semiconductor device and a master to a different semiconductor device. The master device is defined as where a synchronization event originates and terminates. The slave device is defined as taking part in a synchronization event, but not being the origination or termination of the event.

The above disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    synchronizing a master device with a slave device, wherein the master device comprises a semiconductor device and wherein synchronizing comprises:
    transmitting a first synchronization marker data pattern via a first serial interface from the master device at a first time, wherein the first synchronization marker data pattern includes a first subset of a plurality of data segments that includes a first data segment comprising:
    a first encoded data element; and
    one of:
        a first frame header comprising a first header and a copy of the first header; and
        a first transition header comprising the first header and an inverse of the first header;
    receiving a second synchronization marker data pattern via a second serial interface at the master device at a second time in response to transmitting the first synchronization marker data pattern;
    wherein each of the plurality of data segments comprises:
        a corresponding encoded byte; and
        one of:
            a corresponding frame header comprising a corresponding header and a copy of the corresponding header; and
            a corresponding transition header comprising the corresponding header and an inverse of the corresponding header, and
    wherein every $N^{th}$ data segment of the plurality of data segments includes the corresponding frame header, wherein N is a predetermined periodic selection number.

2. The method of claim 1, wherein the first encoded data element is encoded using a data scrambler.

3. The method of claim 1, wherein transmitting and receiving the first and second synchronization marker data patterns is independent of transmission of the request and is independent of reception of the reply.

4. The method of claim 1, wherein the second synchronization marker data pattern includes a second subset of the plurality of data segments including a second data segment comprising:
    a second encoded data element; and
    one of:
        a second frame header comprising a second header and a copy of the second header; and
        a second transition header comprising the second header and an inverse of the second header.

5. The method of claim 1, wherein N has a value of 128.

6. The method of claim 1, wherein the first serial interface is the same as the second serial interface.

7. The method of claim 1, wherein the first serial interface is distinct from the second serial interface.

8. An apparatus comprising a master device that is a semiconductor device, the master device comprising:
   an encoder to generate a first synchronization marker data pattern, wherein the first synchronization marker data pattern includes a first subset of a plurality of data segments, and wherein the first subset of the plurality of data segments includes a first data segment comprising:
      a first encoded data element; and
      one of:
         a first frame header comprising a first header and a copy of the first header; and
         a first transition header comprising the first header and an inverse of the first header;
   wherein each of the first subset of the plurality of data segments comprises:
      a corresponding encoded data element; and
      one of:
         a corresponding frame header comprising a corresponding header and a copy of the corresponding header; and
         a corresponding transition header comprising the corresponding header and an inverse of the corresponding header;
   wherein every Nth data segment of the first subset of the plurality of data segments includes the corresponding frame header, wherein N is a predetermined periodic selection number, and wherein each encoded data element is encoded using a data scrambler;
   a transmitting interface to transmit, via a first serial interface, the first synchronization marker data pattern at a first time; and
   a receiving interface to receive, via a second serial interface, a second synchronization marker data pattern at a second time from a slave device in response to the transmitted first synchronization marker data pattern;
   wherein the master device is configured to synchronize with the slave device based at least in part on the first time and the second time.

9. The apparatus of claim 8, wherein the second synchronization marker data pattern comprises a second subset of the plurality of data segments that includes a second data segment comprising:
   a second encoded data element; and
   one of:
      a second frame header comprising a second header and a copy of the second header; and
      a first transition header comprising the second header and an inverse of the second header.

10. The apparatus of claim 8, wherein the first header is not larger than one bit.

11. The apparatus of claim 8, wherein the data scrambler is a recoverable scrambler based on a polynomial.

12. An apparatus comprising a first slave device that comprises a semiconductor device, the first slave device comprising:
   a receiving interface to receive, via a first serial interface, a first synchronization marker data pattern;
   an encoder to generate a second synchronization marker data pattern in response to receipt by the first slave device of the first synchronization marker data pattern; and
   a transmitting interface to transmit, via a second serial interface, the second synchronization marker data pattern;
   wherein the second synchronization marker data pattern includes a plurality of data segments including a first data segment comprising:
   a first encoded data element, wherein the first encoded data element is encoded using a data scrambler; and
   one of:
      a first frame header comprising a first header and a copy of the first header; and
      a first transition header comprising the first header and an inverse of the first header
   wherein each of the plurality of data segments comprises:
      a corresponding encoded byte; and
      one of:
         a corresponding frame header comprising a corresponding header and a copy of the corresponding header; and
         a corresponding transition header comprising the corresponding header and an inverse of the corresponding header, and
   wherein every $N^{th}$ data segment of the plurality of data segments includes the corresponding frame header, wherein N is a predetermined periodic selection number.

13. The apparatus of claim 12, wherein the first slave device is further configured to:
   generate a third synchronization marker data pattern;
   transmit the third synchronization marker data pattern at a first time;
   receive a fourth synchronization marker data pattern at a second time from a second slave device in response to the transmitted third synchronization marker data pattern; and
   synchronize the first slave device with the second slave device based at least on the first time and the second time.

14. The apparatus of claim 12, wherein the first serial interface is a downstream serial interface and the second serial interface is an upstream serial interface, wherein the downstream serial interface is distinct from the upstream serial interface.

15. The apparatus of claim 12, wherein the data scrambler is a recoverable scrambler based on a polynomial.

16. The apparatus of claim 12, wherein the first header is not larger than one bit.

17. The apparatus of claim 12, wherein N has a value of 128.

18. The apparatus of claim 12, wherein the first header is not larger than one bit.

19. The method of claim 1, further comprising determining, based at least in part on the first time and the second time, a third time when a reply is to be received by the master device in response to a request transmitted from the master device to the slave device.

* * * * *